(12) United States Patent
Koh et al.

(10) Patent No.: US 7,732,341 B2
(45) Date of Patent: Jun. 8, 2010

(54) METHOD OF FORMING A HARD MASK AND METHOD OF FORMING A FINE PATTERN OF SEMICONDUCTOR DEVICE USING THE SAME

(75) Inventors: Cha-won Koh, Yongin-si (KR); Han-ku Cho, Seongnam-si (KR); Jeong-lim Nam, Yongin-si (KR); Gi-sung Yeo, Seoul (KR); Joon-soo Park, Seongnam-si (KR); Ji-young Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 412 days.

(21) Appl. No.: 11/727,124

(22) Filed: Mar. 23, 2007

(65) Prior Publication Data

US 2008/0090419 A1    Apr. 17, 2008

(30) Foreign Application Priority Data

Oct. 17, 2006    (KR) ...................... 10-2006-0101029

(51) Int. Cl.
*H01L 21/302* (2006.01)

(52) U.S. Cl. ........................ 438/717; 438/671; 438/551; 438/552; 438/700; 438/702; 438/723; 438/725; 438/736; 257/E21.026; 257/E21.027

(58) Field of Classification Search ................ 438/706, 438/723, 725, 700, 702, 717, 736, 671, 551, 438/552; 257/E21.026, E21.027
See application file for complete search history.

(56) References Cited

U.S. PATENT DOCUMENTS 6,638,441 B2   10/2003   Chang et al.
6,719,808 B1 *  4/2004   Kim et al. .................... 438/710
7,384,728 B2 *  6/2008   Huang ......................... 430/316
7,553,740 B2 *  6/2009   Sharp et al. .................. 438/424
2005/0136616 A1 *  6/2005   Cho et al. .................... 438/425
2006/0240361 A1 * 10/2006   Lee et al. ..................... 430/313
2007/0262451 A1 * 11/2007   Rachmady et al. .......... 257/758

FOREIGN PATENT DOCUMENTS

KR          100137543 B1    2/1998
KR        1020010003465 A   1/2001

* cited by examiner

*Primary Examiner*—N Drew Richards
*Assistant Examiner*—Jae Lee
(74) *Attorney, Agent, or Firm*—Volentine & Whitt, PLLC

(57) ABSTRACT

A method of forming hard mask employs a double patterning technique. A first hard mask layer is formed on a substrate, and a first sacrificial pattern is formed on the first hard mask layer by photolithography. Features of the first sacrificial pattern are spaced from one another by a first pitch. A second hard mask layer is then formed conformally on the first sacrificial pattern and the first hard mask layer so as to delimit recesses between adjacent features of the first sacrificial pattern. Upper portions of the second hard mask layer are removed to expose the first sacrificial pattern, and the exposed first sacrificial pattern and the second sacrificial pattern are removed. The second hard mask layer and the first hard mask layer are then etched to form a hard mask composed of residual portions of the first hard mask layer and the second hard mask layer. A fine pattern of a semiconductor device, such as a trench isolation region or a pattern of contact holes, can be formed using the hard mask as an etch mask.

21 Claims, 13 Drawing Sheets

METHOD OF FORMING A HARD MASK AND METHOD OF FORMING A FINE PATTERN OF SEMICONDUCTOR DEVICE USING THE SAME

BACKGROUND OF THE INVENTION

1. Field of the Invention

The present invention relates to a method of forming a fine pattern on a substrate in the manufacturing of a semiconductor device or the like. More specifically, the present invention relates to a method of forming a hard mask used to mask a substrate during an etching process in the manufacturing of a semiconductor device or the like.

2. Description of the Related Art

Fabricating a highly integrated semiconductor device entails forming fine patterns on several layers on a substrate. For example, contact holes are formed in a fine pattern in an interlayer insulating layer on the substrate. Contacts are formed in the contact holes to electrically connect circuit features that are formed on opposite sides of the insulating layer. Thus, the basic features, e.g., the contact holes, of a semiconductor device pattern must be formed close together within a small area if the device is to be highly integrated. Accordingly, manufacturing techniques are constantly being developed/improved with an aim to reduce the pitch of the pattern, which is the sum of the width of a basic feature of the pattern and the width of the gap that exists between that feature and the adjacent feature.

Photolithography is one of the techniques used to manufacture highly integrated semiconductor devices, i.e., devices having small design rules. Basically, photolithography is an optical technique by which an image of a desired pattern can be transcribed onto a substrate. Currently, the fineness of the pitch of the pattern that can be transcribed onto the substrate using photolithography has reached a limit due to the limited resolution which can be achieved using photolithography. In particular, the pitch of contact holes which can be formed in an insulating film using photolithography has reached a limit.

However, double patterning has been suggested as a means of overcoming the limitations imposed by the resolution of the photolithography process itself. In a typical double patterning method, first, a mask of repeated features is formed using photolithography. These features are spaced at a predetermined pitch that is relatively large due the limited resolution of the photolithography process. Next, spacers are formed on opposite sides of each of the features of the mask, respectively. Finally, the layer(s) underlying the mask is/are etched using the spacers and the mask together as a hard mask. However, the process by which the spacers are formed tends to form the spacers unevenly on the sides of each feature of the mask pattern. Accordingly, the spacers are often made thicker than desired to ensure that the spacers on the sides of each feature of the mask have the same thickness. Therefore, it is difficult to remove the spacers after using them as a hard mask. Also, the spacers surround each feature of the mask. Therefore, the spacers must be trimmed from the ends of the features of the mask in the case in which line patterns are to be formed using the spacers.

Furthermore, when a double patterning method is used to form contact holes, the dimensions of the contact holes and the layout of the contact holes must be indirectly designed for. That is, the dimensions of the patterns used to form the contact holes are designed with an aim of producing a desired layout of the contact holes. Accordingly, the dimensional accuracy of a fine pattern of contact holes of a semiconductor device depends on the accuracy of the patterns of the hard mask formed during the double patterning method. As is clear from the description above, the hard mask forms an opening around a region of the underlying layer in which a contact hole is to be formed. Therefore, a dimensional error in the hard mask can cause the dimensions of the contact holes to be off by an amount twice the dimensional error of the hard mask in some cases.

Thus, the forming of a fine pattern, and especially of a fine pattern of contact holes, allows for only small margins of error in the critical dimensions (CD) and uniformity of the CD of the pattern of the hard mask. However, the uniformity of the CD of the pattern of a hard mask formed using the conventional double patterning method can not be limited to the degree necessary to fabricate highly integrated semiconductor devices having fine patterns with a design rule of 30 nm or less. That is, the conventional double patterning method produces large numbers of defective products, and is therefore an impediment to the overall productivity of a process of manufacturing highly integrated semiconductor device.

SUMMARY OF THE INVENTION

An object of the present invention is to provide a method of forming a hard mask having a pattern whose features are spaced by a pitch finer than that which can be formed using photolithography alone.

Likewise, an object of the present invention is to provide a method of forming a fine pattern of a semiconductor device whose features are spaced by a pitch finer than that which can be formed using photolithography alone Another object of the present invention is to provide a method of forming a fine pattern of a semiconductor device whose features have highly uniform critical dimensions (CD).

Still another object of the present invention is to provide a method of forming a fine pattern of a semiconductor device, which facilitates the production of the design layout for each step in the method.

According to one aspect of the present invention, there is provided a method of forming a hard mask composed of residual portions of a first hard mask layer and a second hard mask layer. The first hard mask layer is formed on a substrate. Then, a first sacrificial pattern is formed on the first hard mask layer. The features constituting the first sacrificial pattern are spaced from one another by a first pitch. The second hard mask layer is then formed on the first sacrificial pattern and the first hard mask layer. The second hard mask layer delimits recesses between pairs of adjacent ones of the features of the first sacrificial pattern, respectively. Next, upper portions of the second hard mask layer are removed to expose the first sacrificial pattern. The first sacrificial pattern and the second sacrificial pattern are subsequently removed. Finally, the second hard mask layer and the first hard mask layer are etched to form the hard mask.

The first hard mask layer and the second hard mask layer may each be composed of a material having an etch selectivity with respect to the material of the first sacrificial pattern and the second sacrificial pattern.

Also, the first sacrificial pattern and the second sacrificial pattern may be formed so as to occupy the same stratum.

The method of forming the hard mask pattern may further comprise removing a portion of the first hard mask layer exposed between features of the first sacrificial pattern to form recesses in the first hard mask layer. These recesses in the first hard mask layer are formed before the second hard mask layer is formed. In this case, the second hard mask layer may be formed conformally over the first sacrificial pattern and surfaces of the first hard mask layer defining the bottom of the recesses, and to a thickness equal to the depth of the recesses, i.e., equal to thickness of the portion of the first hard mask layer removed from between the features of the first sacrificial pattern.

According to another aspect of the present invention, there is provided a method of forming a hard mask in which the features of the hard mask are located at positions corresponding to the locations of sidewalls of a second hard mask layer so that the features can be spaced by a pitch smaller than that which can be achieved by photolithography. First, a first hard mask layer is formed on a substrate. Next, a first sacrificial pattern is formed by photolithography on the first mask layer. The first sacrificial pattern has substantially identical features spaced from one another in a first direction by a first pitch. Subsequently, side walls are formed along sides of the features of the first sacrificial pattern, respectively. The side walls delimit a respective recess between each pair of adjacent ones of the features of the first sacrificial pattern. The first sacrificial pattern is subsequently removed while leaving the side walls extending upright on the first hard mask layer. Finally, the side walls and the first hard mask layer are etched to form a pattern of features located at positions corresponding to the locations of all of the sidewalls of the second hard mask layer.

According to yet another aspect of the present invention, there is provided a method of forming a fine pattern of a semiconductor device which comprises forming a hard mask according to the present invention, and etching an underlying first film using the hard mask. Thus, the fine pattern formed in the underlying film will be constituted by features spaced from one another by a pitch that is a fraction, and more specifically ½ or about ½, that of the pitch that can be achieved by photolithography alone.

According to one aspect of the method of forming a fine pattern of a semiconductor device according to the present invention, a nitride film is formed on the first film before the first hard mask layer is formed. The nitride film is etched using the hard mask pattern as an etch mask to form a nitride film pattern on the underlying first film. The underlying etch film is etched using the nitride film pattern as an etch mask to pattern the first film.

According to still another aspect of the method of forming a fine pattern of a semiconductor device according to the present invention, the substrate itself may be etched using the nitride film pattern as an etch mask to form trenches in the substrate. In this case, the trenches are filled with an insulating film to form isolation regions.

According to still another aspect of the method of forming a fine pattern of a semiconductor device according to the present invention, the fine pattern may be a pattern of contact holes. In this case, a mask having an opening is formed on the substrate after the hard mask is formed and before the first film is etched. Portions of the first film and of the hard mask are exposed via the opening. The exposed portion of the first film is etched using the exposed portion of the hard mask and the mask having the opening as an etch mask. The opening in the mask is elongate. The width of the opening of the mask thus establishes one dimension of the contact holes, and the length of the opening is aligned in the direction of the first pitch so as to establish the number of contact holes that are formed.

According to another aspect of the present invention, there is provided a method of forming an ultra fine pattern of contact holes of a semiconductor device comprising forming a hard mask according to the present invention, and using the hard mask as an etch mask. First, a substrate on which an electrically insulating film is disposed is provided. A first film and a first hard mask layer are formed on the insulating film. Next, a first sacrificial pattern is formed on the first hard mask layer. The first sacrificial pattern has substantially identical features that are spaced from one another by a first pitch. Then, a second hard mask layer is formed on the first sacrificial pattern and the first hard mask layer. The second hard mask layer delimits recesses between pairs of adjacent ones of the features of the first sacrificial pattern, respectively. A second sacrificial pattern is then formed within the recesses. Upper portions of the second hard mask layer are subsequently removed to expose the first sacrificial pattern. Subsequently, the first sacrificial pattern and the second sacrificial pattern are removed to expose side walls of the second hard mask layer. The side walls form projections on the first hard mask layer. The projections may have the shape of a series of relatively short parallel lines. A mask is then formed on the substrate. The mask defines an opening that exposes portions of the first hard mask layer and second hard mask layer. The exposed portions of the second hard mask layer and the first hard mask layer are etched using the mask as an etch mask to form a hard mask made up of residual portions of the first hard mask layer and the second hard mask layer. The first film disposed on the substrate is etched using the mask having the opening and the hard mask together as an etch mask to thereby pattern the first layer, and the insulating film is etched using the mask having the opening and the patterned first layer together as an etch mask to form the contact holes in the insulating film.

BRIEF DESCRIPTION OF THE DRAWINGS

The above and other objects, features and advantages of the present invention will become more apparent from the following detail description of the preferred embodiments thereof made with reference to the attached drawings in which.

DETAILED DESCRIPTION OF THE PREFERRED EMBODIMENTS

Figure 1A:
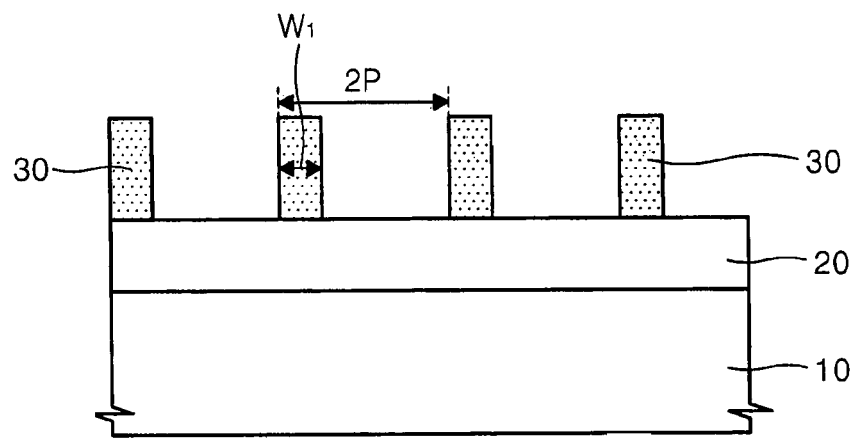
FIGS. 1A through 1H are each a sectional view of part of a substrate and together sequentially illustrate a method of forming a hard mask according to the present invention.

FIGS. 1A through 1H sequentially illustrate a method of forming a hard mask according to the present invention. Referring first to FIG. 1A, a first hard mask layer 20 is formed on a substrate 10. A first sacrificial pattern 30 is then formed on the first hard mask layer 20 by photolithography. The first sacrificial pattern 30 has a first pitch 2P that is twice the pitch P of the pattern of the hard mask to be formed on the substrate 10. The width W1 of the features constituting the first sacrificial pattern 30 may be ¼ of the first pitch 2P. The features constituting the first sacrificial pattern 30 may be a series of parallel lines spaced from one another in a predetermined direction on the substrate 10.

The first hard mask layer 20 is made of a material selected according to the material to be etched. In particular, the first hard mask layer 20 is of a material having an etch selectivity with respect to the underlying material to be etched (not shown in FIGS. 1A-1H). For example, the first hard mask layer 20 may be an oxide film, a nitride film or a combination of oxide and/or nitride films. More specifically, the first hard mask layer 20 may be of at least one oxide selected from the group consisting of thermal oxides, chemical vapor deposition (CVD) oxides, undoped silicate glass (USG) and high density plasma (HDP) oxides. Alternatively, the first hard mask layer 20 may be of at least one nitride selected from the group consisting of SiON, SiN, SiBN and BN. Also, the first hard mask layer 20 may have a stacked structure of nitride and oxide films selected from the groups listed above. As another alternative, the first hard mask layer 20 may be a layer of polysilicon.

Also, the first hard mask layer 20 and the first sacrificial pattern 30 are preferably of materials having different etching characteristics, i.e., are of materials having an etch selectivity for a given etchant. For example, the first sacrificial pattern 30 may be formed of polysilicon if the first hard mask layer 20 is an oxide film or a nitride film. The first sacrificial pattern 30 may be formed of an oxide, e.g., silicon-on-glass (SOG) or a flowable oxide (FOX) if the first hard mask layer 20 is a nitride film. In any case, the material constituting the first sacrificial pattern 30 is determined in consideration of the material of the first hard mask layer 20 and the material to be etched.

Figure 1B:
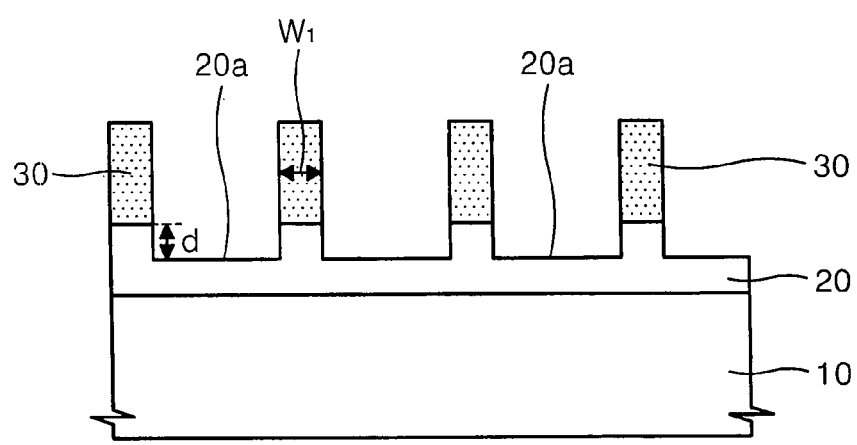

Referring to FIG. 1B, a portion of that part of the first hard mask layer 20 which is exposed between the first sacrificial patterns 30 is removed, thereby forming recesses 20a in the first hard mask layer 20. The thickness d of the portion of the first hard mask layer 20 that is removed, i.e., the depth of the recesses 20a, may be equal to the width W1 of the features (e.g., the lines) constituting the first sacrificial pattern 30. In this respect, the recesses 20a may be formed in the first hard mask layer 20 using a dry etching method. For example, the first sacrificial pattern 30 may be formed by dry etching, and during this process the layer constituting the first sacrificial pattern 30 may be over-etched to thereby form the recesses 20a. Alternatively, the first sacrificial pattern 30 may be formed by one etching process, and the first hard mask layer 20 may be dry etched separately to form the recesses 20a.

Figure 1C:
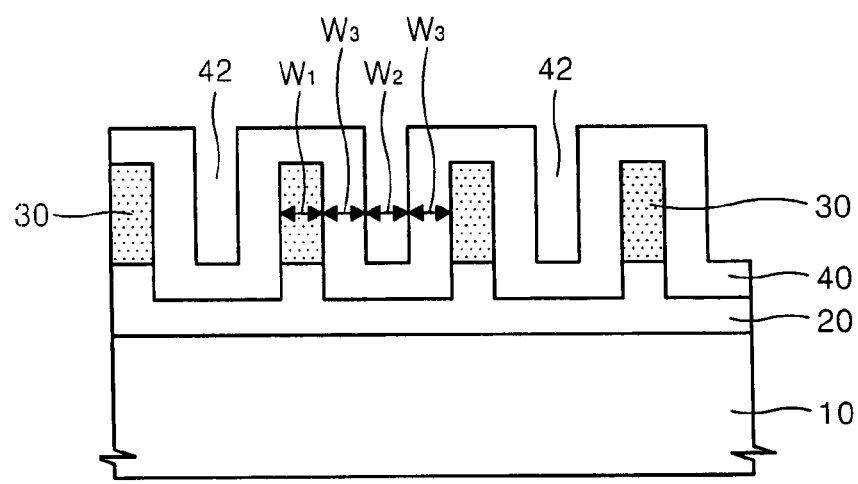

Referring to FIG. 1C, a second hard mask layer 40 is formed over the substrate 10. Preferably, the second hard mask layer 40 is formed conformally over the first sacrificial pattern 30 and the first hard mask layer 20 and so as to have a uniform thickness. Also, the thickness of the second hard mask layer 40 is preferably equal to the thickness d of the portion of the first hard mask layer 20 that was removed to form the recesses 20a. In any case, the second hard mask layer 40 defines recesses 42 between adjacent features of the sacrificial pattern 30. The thickness of the second hard mask layer 40 is determined so that the width W2 of the recesses 42 is ¼ of the first pitch 2P. Also, the thickness of the second hard mask layer 40 may be such that the width W2 of the recesses 42 equals the width W1 of the features constituting the first sacrificial pattern 30. In this case, the width W3 of the second hard mask layer 40 on the sidewalls of the first sacrificial pattern 30 is ¼ of the first pitch 2P.

The second hard mask layer 40 may be composed of a material having etch characteristics similar to those of the first hard mask layer 20, i.e., the second hard mask layer 40 may be of the same material as the first hard mask layer 20 or may be of a material which is different than that of the first hard mask layer 20 but has etch characteristics similar to those of the first hard mask layer 20. For example, the first hard mask layer 20 and the second hard mask layer 40 may each be an oxide film. In particular, the second hard mask layer 40 may be an oxide film formed by atomic layer deposition (ALD). Also, the second hard mask layer 40 has an etch selectivity with respect to the first sacrificial pattern 30. For example, the second hard mask layer 40 may be a nitride film formed by ALD when the first sacrificial pattern 30 is of polysilicon or an oxide; the second hard mask layer 40 may be an oxide film formed by ALD when the first sacrificial pattern 30 is of polysilicon or a nitride; and the second hard mask layer 40 may be a polysilicon film formed by ALD when the first sacrificial pattern 30 is of an oxide or a nitride.

Figure 1D:
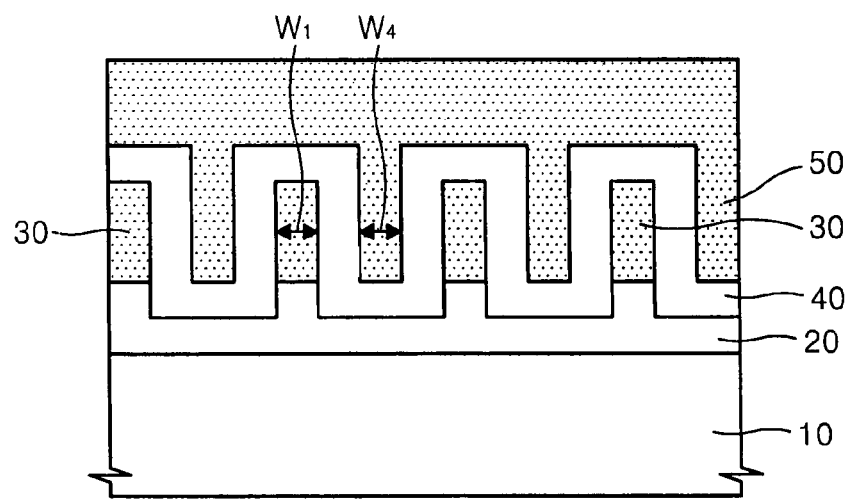

Referring to FIG. 1D, a second sacrificial film 50 is formed on the substrate 10 to such a thickness as to cover the second hard mask layer 40 and thereby fill the recesses 42 defined by the second hard mask layer 40 (refer back to FIG. 1C). Thus, the width W4 of each portion of the second sacrificial film 50 filling a respective recess 42 is ¼ of the first pitch 2P when the thickness of the second hard mask layer 40, i.e., the width W3, is ¼ of the first pitch 2P. The second sacrificial film 50 may be composed of a material having etching characteristics similar to those of the first sacrificial pattern 30. For example, the second sacrificial film 50 may be a polysilicon film when the second hard mask layer 40 is an oxide film or a nitride film.

Figure 1E:
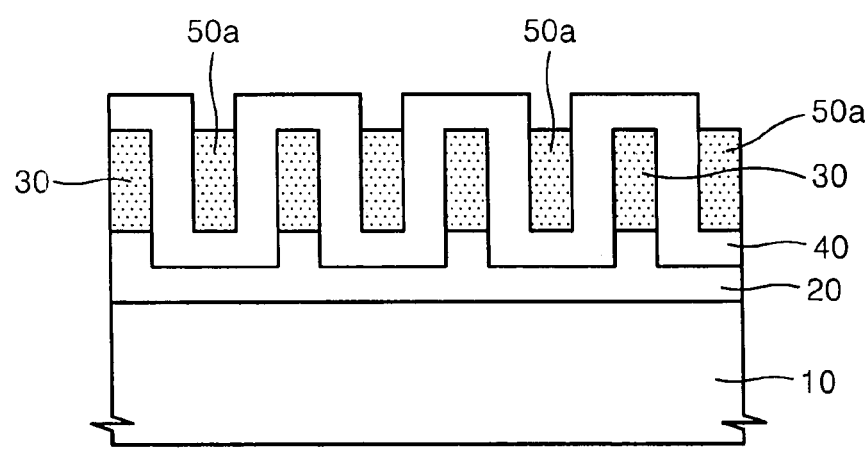

Referring to FIG. 1E, the second sacrificial film 50 is etched until upper portions of the second hard mask layer 40 are exposed. In this respect, the second sacrificial film 50 may be wet etched. As a result, a second sacrificial pattern 50a is formed within the recesses 42. For example, the second sacrificial pattern 50a may be a series of lines extending parallel to those of the first sacrificial pattern 30. Also, the second sacrificial pattern 50a occupies approximately the same stratum as the first sacrificial pattern 30.

Figure 1F:
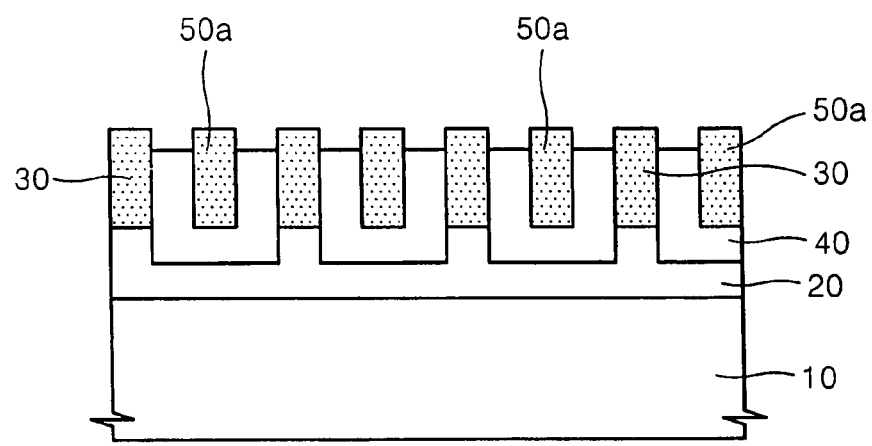

Referring to FIG. 1F, portions of the second hard mask layer 40 which cover the first sacrificial pattern 30 are removed to expose the upper surfaces of the first sacrificial pattern 30. Thus, the upper surfaces of the first sacrificial pattern 30 and the upper surfaces of the second sacrificial pattern 50a are both exposed. Therefore, the features of the first and second sacrificial patterns 30 and 50a form projections having a second pitch P that is ½ of the first pitch 2P of the first sacrificial pattern 30.

The portions of the second hard mask layer 40 which cover the first sacrificial pattern 30 may be removed by wet etching or dry etching. For example, an etchant including fluorine (F) may be used to wet etch the second hard mask layer 40 when the second hard mask layer 40 is an oxide film, and the first and second sacrificial patterns 30 and 50a are of polysilicon. In this case, an etchant including fluorine (F) will provide a relatively high etch selectivity between the second hard mask layer 40 and both the first sacrificial pattern 30 and the second sacrificial pattern 50a.

In the case of wet etching, the etchant may be diluted HF (DHF), NH$_4$F or a combination of these solutions. In particular, the etchant may be DHF in which pure water and HF are mixed in a volumetric ratio of 50:1.

In the case of dry etching, the etchant may include $C_xF_y$ (wherein x and y are each an integer of 1~10). In addition, the etchant may be a mixture of CxFy and $O_2$, or CxFy, $O_2$ and Ar (wherein x and y are each an integer of 1~10). Examples of CxFy are $C_3F_6$, $C_4F_6$, $C_4F_8$ or $C_5F_8$. Also, the dry etching may be a plasma etching process in which the etchant is a plasma of the gas/gases listed above. Alternatively, the dry etching may be a straight dry etching process which does not employ plasma.

Figure 1G:
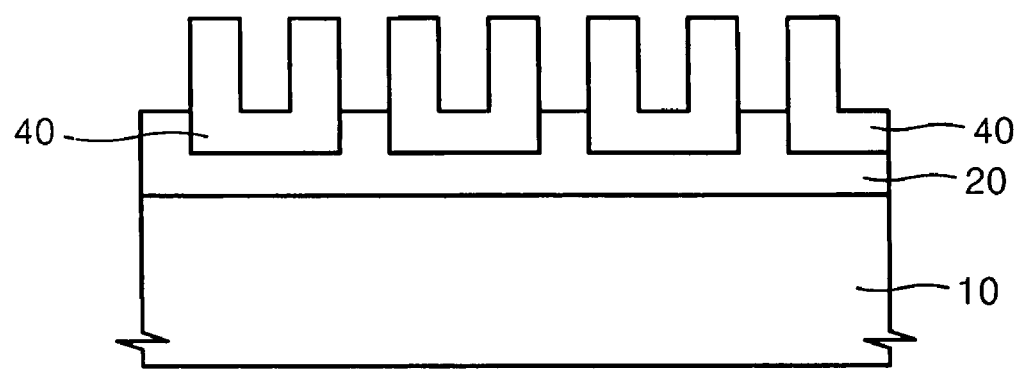

Referring to FIG. 1G, the first sacrificial pattern 30 and the second sacrificial pattern 50a are then completely removed by wet etching or dry etching. In the case of wet etching, for example, an etching solution including $NH_4OH$ may be used as an etchant when the first and the second sacrificial patterns 30 and 50a are of polysilicon. More specifically, the etching solution may be a mixture of $NH_4OH$, $H_2O_2$ and $H_2O$ in a volumetric ratio of 4:1:95. In the case of dry etching, an isotropic chemical dry etching (CDE) method using an etchant including $CF_4$ may be carried out. In particular, the chemical dry etchant may be a mixture of $CF_4$ and $O_2$, or a mixture of $CF_4$, $O_2$, $N_2$ and HF.

In any case, as a result, only the recessed first hard mask layer 20 and portions of the second hard mask layer 40 remain on the substrate 10. The remaining portions of the second hard mask layer 40 form projections exposed on the substrate 10 above the recessed first hard mask layer 20. These projections have a pitch P that is ½ of the first pitch 2P of the first sacrificial pattern 30.

Figure 1H:
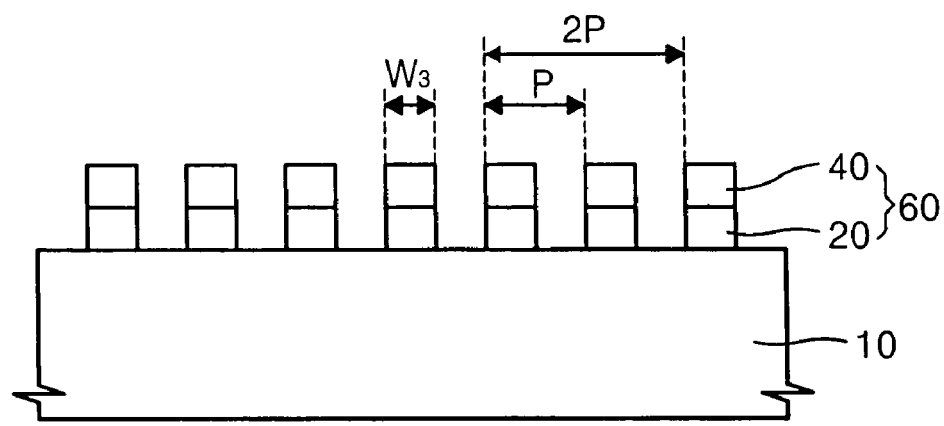

Referring to FIG. 1H, the remaining portions of the second hard mask layer 40 and the first hard mask layer 20 are etched back to form a hard mask 60. More specifically, the remaining portions of the second hard mask layer 40 and the first hard mask layer 20 are sequentially anisotropically dry-etched to form a hard mask 60 consisting of residual portions of the first hard mask layer 20 and the second hard mask layer 40. The features of the pattern of the hard mask 60 may each have a width W3 that is ¼ of the first pitch 2P. The pattern of the hard mask 60 also has a pitch P that is ½ of the first pitch 2P. That is, the pattern of the hard mask 60 has a pitch P that is much finer than that of the pattern formed by photolithography, namely the first sacrificial pattern 30.

FIGS. 2A through 2F illustrate a method of forming of an isolation region of a semiconductor device according to the present invention. Elements in FIGS. 2A through 2F which are similar to those shown and described with reference to FIGS. 1A-1H are denoted by like reference numerals and thus, a detailed description of these elements as well as the techniques by which they are/can be formed will be omitted for the sake of brevity.

Figure 2A:
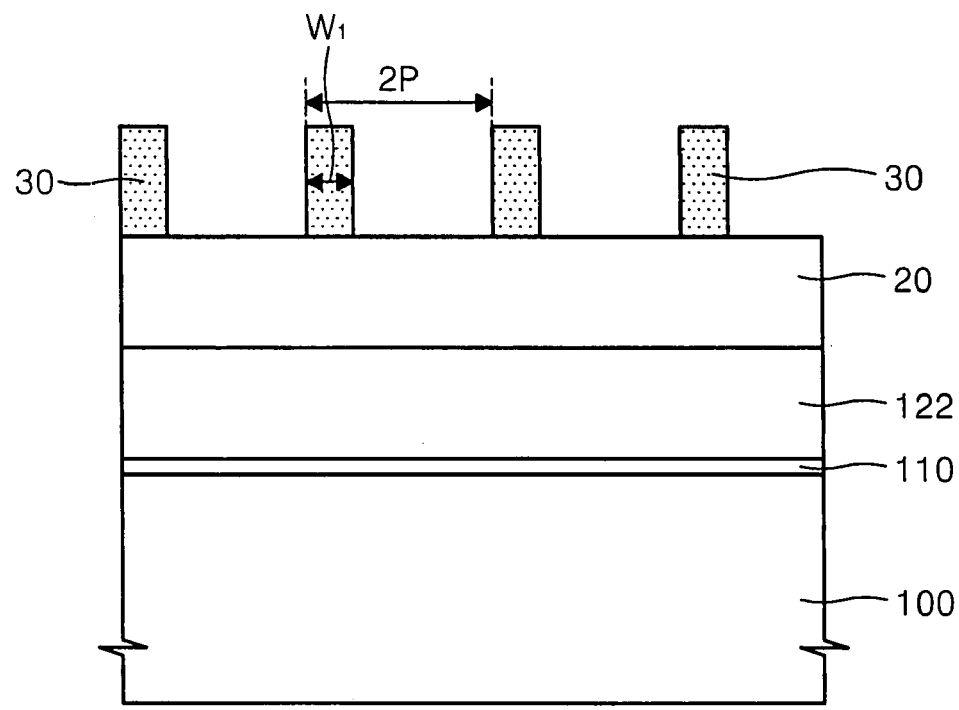
FIGS. 2A through 2F are each a sectional view of part of a substrate and sequentially illustrate a method of forming an isolation region of a semiconductor device according to the present invention.

Referring first to FIG. 2A, a pad oxide film 110 is formed on a semiconductor substrate 100. A nitride film 122 is formed on the pad oxide film 110. Subsequently, a first hard mask layer 20 and a first sacrificial pattern 30 are formed on the nitride film 122 in a manner similar to that described with reference to FIG. 1A.

Figure 2B:
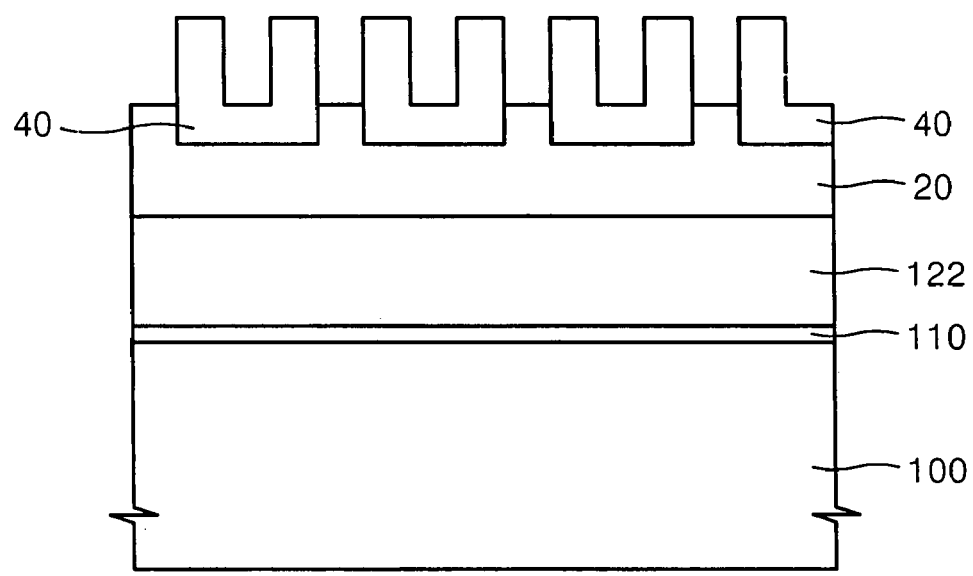

Referring to FIG. 2B, a second hard mask layer 40 is formed on the nitride layer 122 in a manner similar to that described with reference to FIGS. 1B through 1G.

Figure 2C:
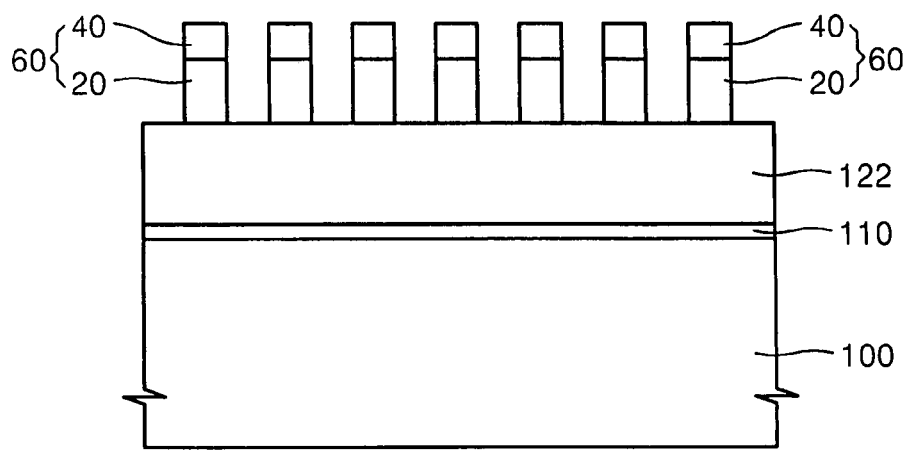

Referring to FIG. 2C, a hard mask pattern is formed on the nitride film 122 in a manner similar to that described with reference to FIG. 1H. Thus, the hard mask 60 is made up of residual portions of the first hard mask layer 20 and the second hard mask layer 40

Figure 2D:
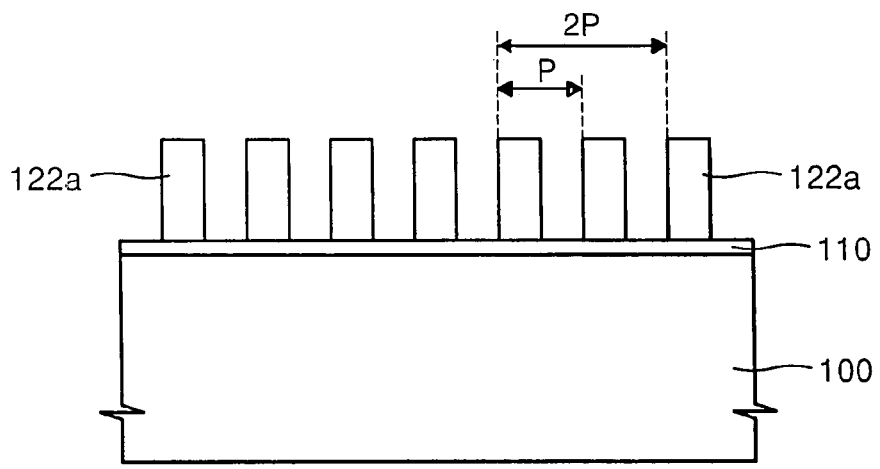

Referring to FIG. 2D, the nitride film 122 is anisotropically dry etched using the hard mask 60 as an etch mask to form a nitride film pattern 122a. The nitride film pattern 122a has a fine pitch P that is ½ of the first pitch 2P of the first sacrificial pattern that is formed using photolithography. Also, note, FIG. 2D does not show any portion of the hard mask 60 as remaining on the nitride film pattern 122a. That is, FIG. 2D shows that the hard mask 60 is completely removed from the nitride film 122 during this anisotropic dry etching process. However, in some cases, a residual portion of the hard mask 60 may remain on the nitride film pattern 122a after the dry etching process.

Figure 2E:
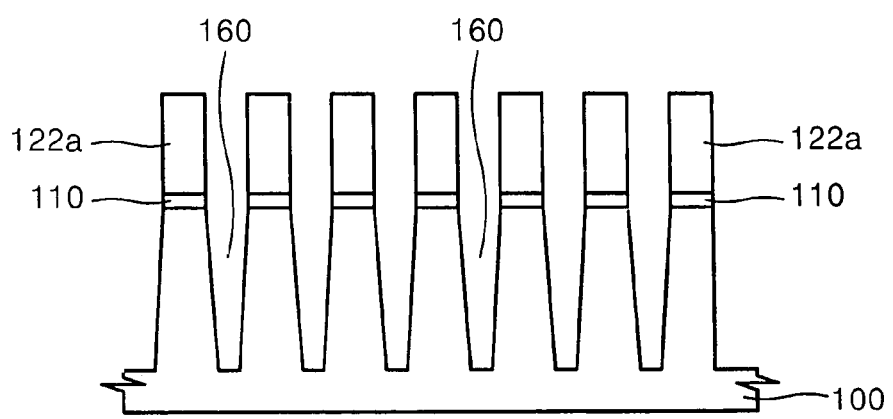

Referring to FIG. 2E, the pad oxide film 110 and the semiconductor substrate 100 are anisotropically dry etched using the nitride film pattern 122a as an etch mask to form trenches 160 in the semiconductor substrate 100.

Figure 2F:
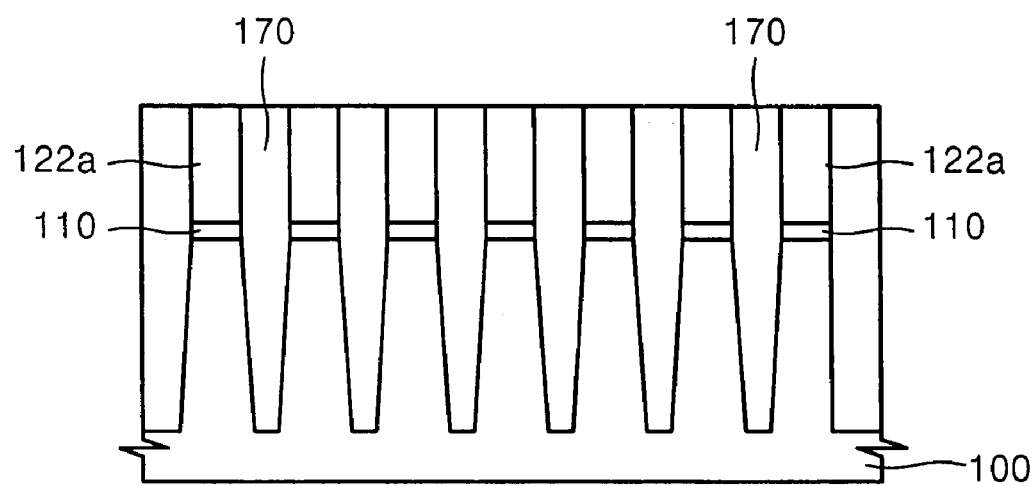

Referring to FIG. 2F, insulating material is deposited over the substrate to fill the trenches 160 and cover the nitride film pattern 122a. Then, the resulting structure is planarized by chemical mechanical polishing (CMP) until the nitride film pattern 122a is exposed. The resulting insulation layer 170 isolates active regions from one another, i.e., forms a trench isolation region.

Figure 3:
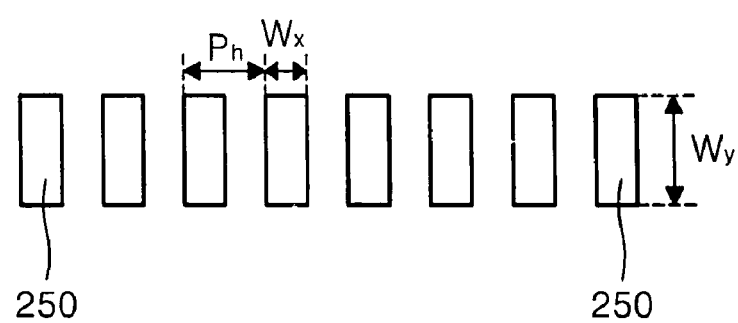
FIG. 3 is a diagram of the layout of contact holes of a semiconductor device formed according to a method of the present invention.

FIG. 3 shows a pattern 250 of contact holes of a semiconductor device which can be formed according to the present invention. In FIG. 3, the pitch of the pattern 250 of the contact holes is denoted by Ph, the dimension of the contact holes in the direction of an X-axis is denoted by Wx, and the dimension of the contact holes in the direction of a Y-axis orthogonal to the X-axis is denoted by Wy. The X-axis is an arbitrary axis that runs in the direction of the shortest dimension of the contacts holes. Thus, the width of each of the contact holes is denoted by Wx. Wy may denote the length (as illustrated) or width of the contact holes depending on their shape.

FIGS. 4A and 4B through 7A and 7B illustrate one method of forming such contact holes according to the present invention. Also, in FIGS. 4A and 4B through 7A and 7B, elements which are similar to those shown and described with reference to FIGS. 1A-1H are denoted by like reference numerals and thus, a detailed description of these elements as well as the techniques by which they are/can be formed will be omitted for the sake of brevity.

Figure 4A:
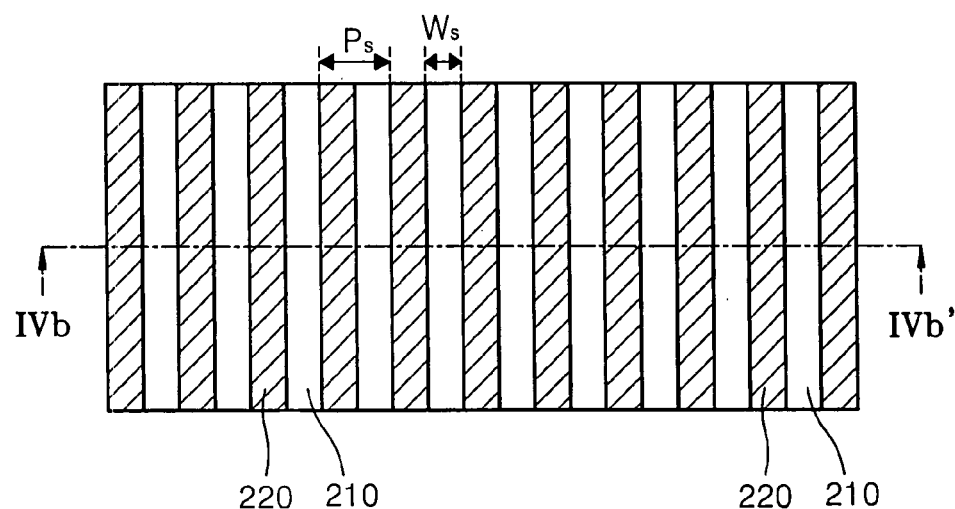
FIGS. 4A, 5A, 6A and 7A are each a plan view of part of a substrate.
Figure 4B:
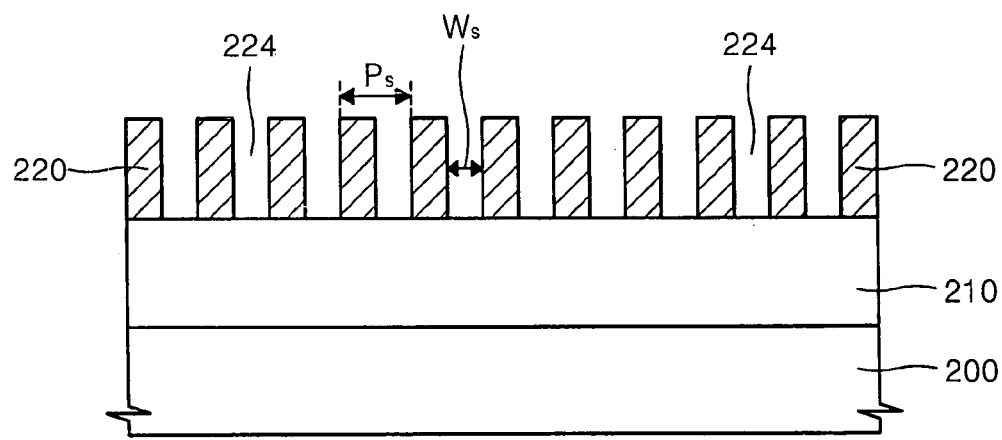
FIGS. 4B, 5B, 6B and 7B are sectional views taken along lines IVb-IVb', Vb-Vb', VIb-VIb', and VIIb-VIIb' of FIGS. 4A, 5A, 6A and 7A, respectively, and together FIGS. 4A though 7A and 4B through 7B sequentially illustrate a method of forming the contact shown in FIG. 3 according to the present invention.

Referring first to FIG. 4A and FIG. 4B, an interlayer insulating film 210 is formed on a semiconductor substrate 200. Also, a hard mask 220 having a line and space pattern is formed on the interlayer insulating film 210 using the method shown and described with reference to FIGS. 1A through 1H (in which case the hard mask 220 consists of residual portions of a first hard mask layer and a second hard mask layer) or the method shown and described with reference to FIGS. 2A through 2D (in which case the hard mask 220 consists of a patterned nitride film). The interlayer insulating film 210 may be an oxide film. In this case, the hard mask 220 may be composed of a nitride.

The pattern of the hard mask 220 has a pitch Ps equal to the pitch Ph of the contact hole pattern 250 to be formed (refer back to FIG. 3). Also, the width Ws of each space 224 between the adjacent line features of the hard mask 220 depends on the width W1 of each line feature of the first sacrificial pattern 30 formed as described with reference to FIG. 1B, and the width W4 of each line feature of the second sacrificial pattern 50a formed as described with reference to FIG. 1E. The width W1 of each line feature of the first sacrificial pattern 30 is determined by the design layout of the first sacrificial pattern 30. Also, the uniformity of the widths W4 of the line features of the second sacrificial pattern 50a depends on the uniformity of the widths W1 of the line features of the first sacrificial pattern 30. Accordingly, the uniformity of the widths Ws of the spaces 224 of the pattern of the hard mask 220 is approximately the same as the uniformity of the widths W1 of the line features of the first sacrificial pattern 30. The width W1 of each line feature of the first sacrificial pattern 30 and the widths W4 of each line feature of the second sacrificial pattern 50a are designed to produce the desired width Wx of the contact holes. That is, the widths Wx of the contact holes and the pitch Ph of the contact hole pattern 250 have values each corresponding to the widths Ws and the pitch Ps of the spaces 224 of the pattern of the hard mask 220. Accordingly, the width Wx of each of the contact holes depends on the width W1 of each line feature of the first sacrificial pattern 30. Therefore, the widths Wx of the contact holes and the pitch Ph of the contact hole pattern 250 are unlikely to deviate from their design values, or at worst will deviate only a minimal amount.

Figure 5A:
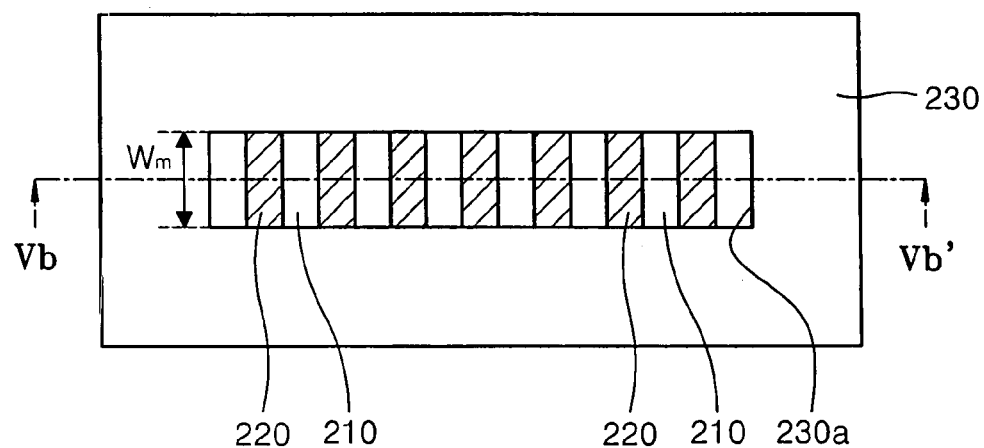
Figure 5B:
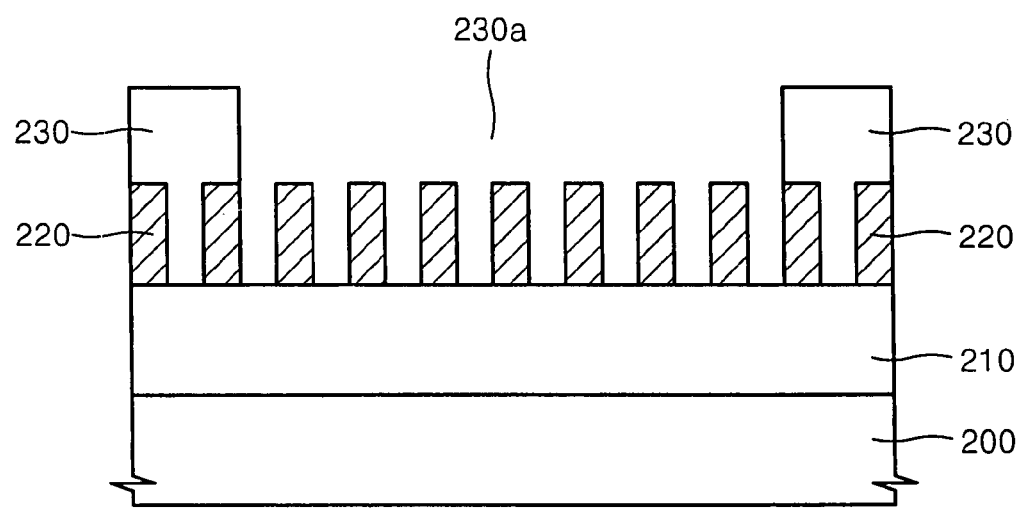

Referring to FIG. 5A and FIG. 5B, a mask 230 is formed on the insulating film 210 over the hard mask 220. The mask 230 defines an elongate opening 230a that exposes a region of the insulating film 210 in which the contact holes will be formed according to the layout of FIG. 3. The width Wm of the opening 230a corresponds to the dimension Wy of the contact holes. That is, the width Wm of the opening 230a of the mask 230 establishes the dimension of the contact holes in a direction perpendicular to the direction in which the contact holes are spaced from one another (the direction of the pitch Ph). The length of the opening 230a is aligned in the direction in which the features of the hard mask 220 are spaced. Thus, the number of contact holes that will be formed corresponds to the length of the opening 230a of the mask 230.

The mask 230 may consist of a photoresist. Alternatively, the mask 230 may have a three-layered structure consisting of spin-on-carbon (SOC), a silicon anti-reflective coating (Si ARC) and photoresist stacked on the insulating film 210 in the foregoing order, or a four-layered structure consisting of SOC, an Si ARC, an organic ARC and a photoresist stacked on the insulating film 210 in the foregoing order.

Figure 6A:
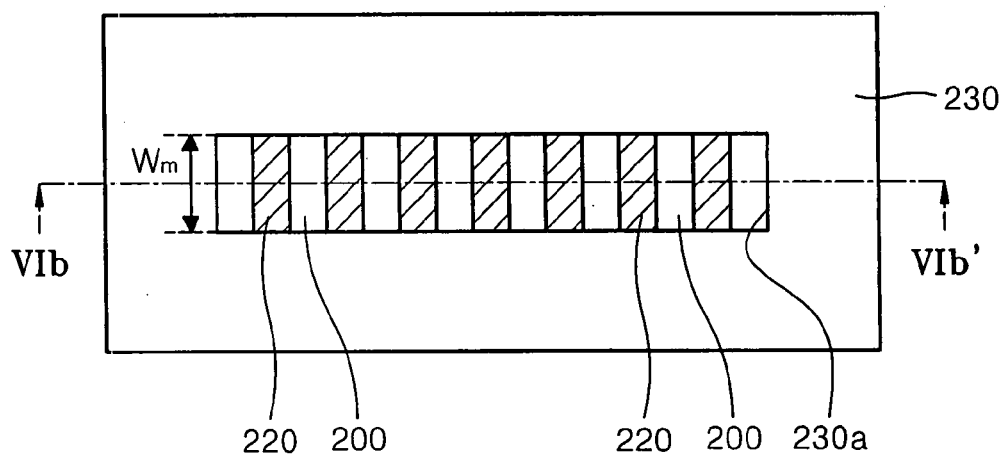
Figure 6B:
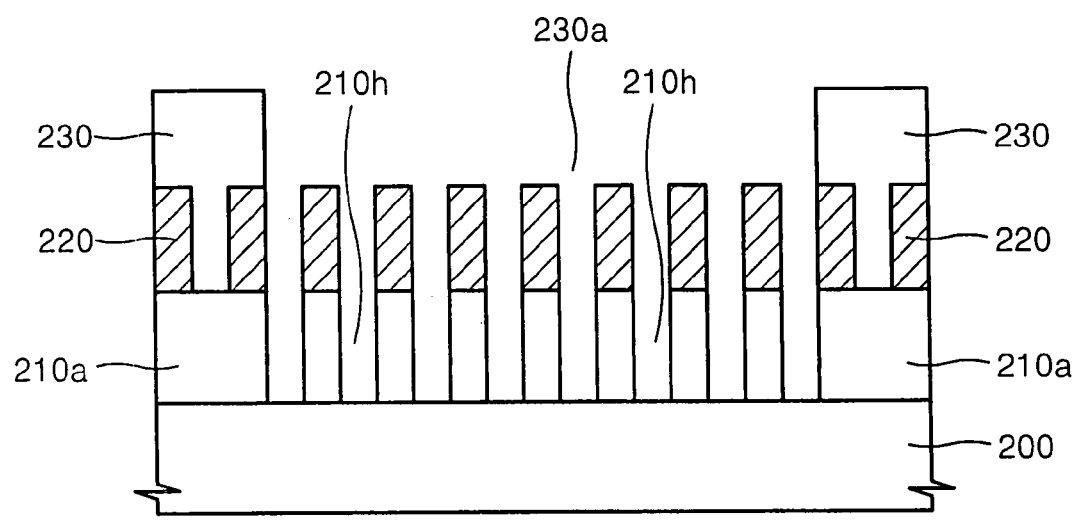

Referring to FIG. 6A and FIG. 6B, the interlayer insulating film 210 is anisotropically dry etched using the mask 230 and the hard mask 220 together as an etch mask to form an interlayer insulating film pattern 210a having contact holes 210h. The contact holes 210h may be direct contact (DC) holes, buried contact (BC) holes or via contact holes that expose active regions of (not shown) or conductive layers (not shown) on the semiconductor substrate 200. Thus, upper surfaces of the semiconductor substrate 200 may be exposed through the contact holes 210h of the interlayer insulating film pattern 210a.

Figure 7A:
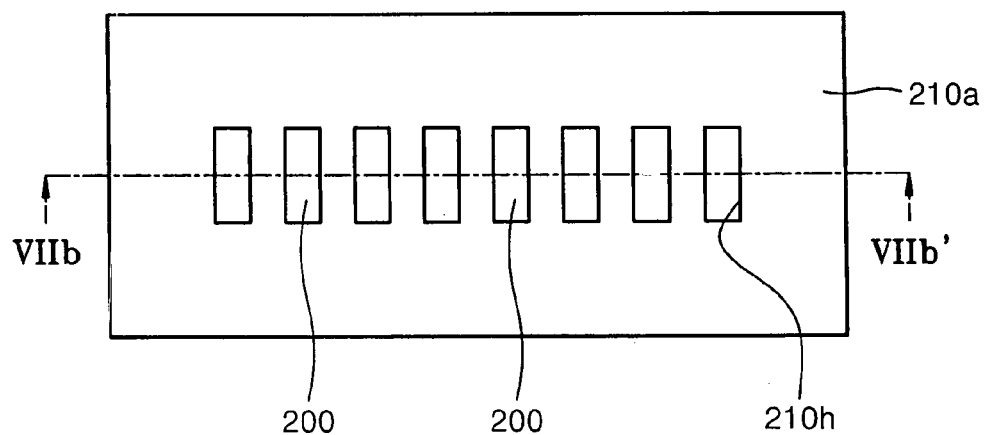
Figure 7B:
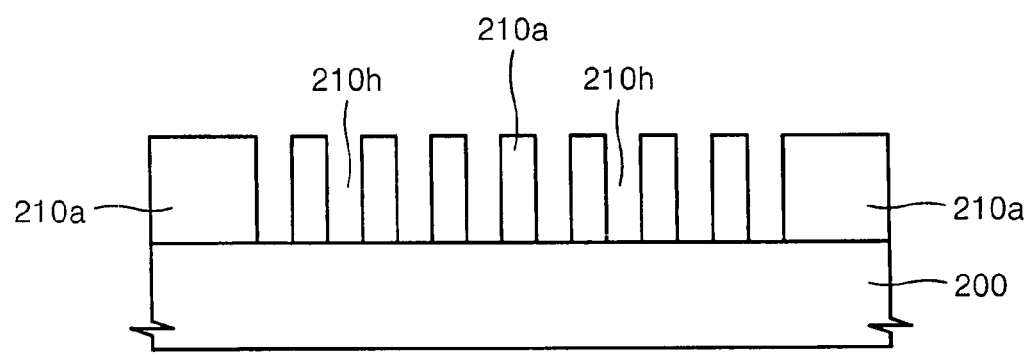

Referring to FIG. 7A and FIG. 7B, the mask 230 and the hard mask 220 are removed.

FIGS. 8A through 8F illustrate another method of forming the contact hole pattern 250 of FIG. 3. Also, in FIGS. 8A through 8F, elements which are similar to those previously shown and described are denoted by like reference numerals and thus, a detailed description of these elements as well as the techniques by which they are/can be formed will be omitted for the sake of brevity.

Figure 8A:
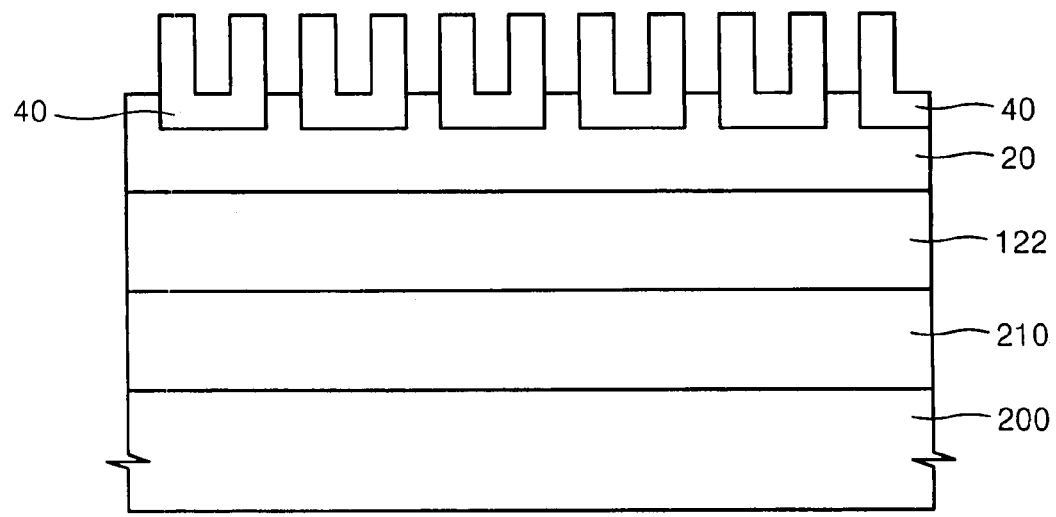
FIGS. 8A through 8F are each a sectional view of part of a substrate and sequentially illustrate another embodiment of a method of forming the contact holes shown in FIG. 3 according to the present invention.

Referring to FIG. 8A, an interlayer insulating film 210 is formed on a semiconductor substrate 200. Then, a nitride film 122 is formed on the interlayer insulating film 210. Also, a first hard mask layer 20 and a second hard mask layer 40 are formed on the nitride film 122, and the second hard mask layer 40 is etched, in a manner similar to that shown and described with reference to FIGS. 1A through 1G. As a result, projections spaced from one another by a pitch P are formed on the first hard mask layer 20. The projections form a series of parallel lines.

Figure 8B:
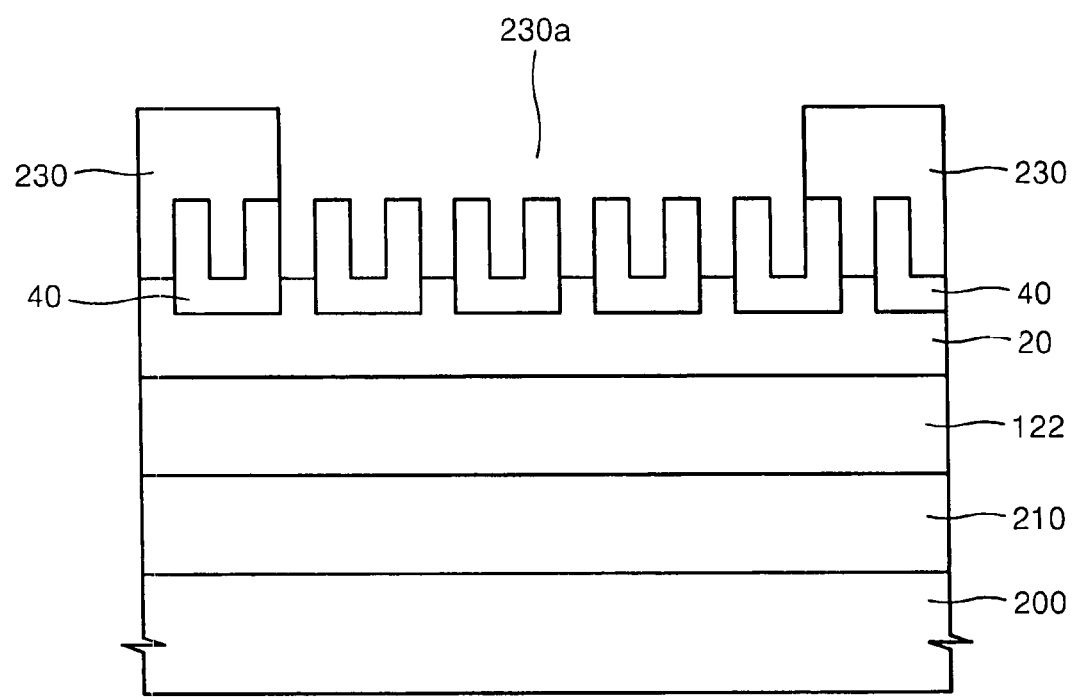

Referring to FIG. 8B, a mask 230 is formed on the first hard mask layer 20 and the remainder of the second hard mask layer 40 in a manner similar to that shown and described with reference to FIGS. 5A and 5B. However, in this case, the first hard mask layer 20 and the remainder of the second hard mask layer 40 are exposed through an opening 230a of the mask 230. The width Wm of the opening 230a of the mask 230 establishes the dimension of the contact holes in a direction perpendicular to the direction in which the contact holes are spaced from one another (the direction of the pitch Ph).

Figure 8C:
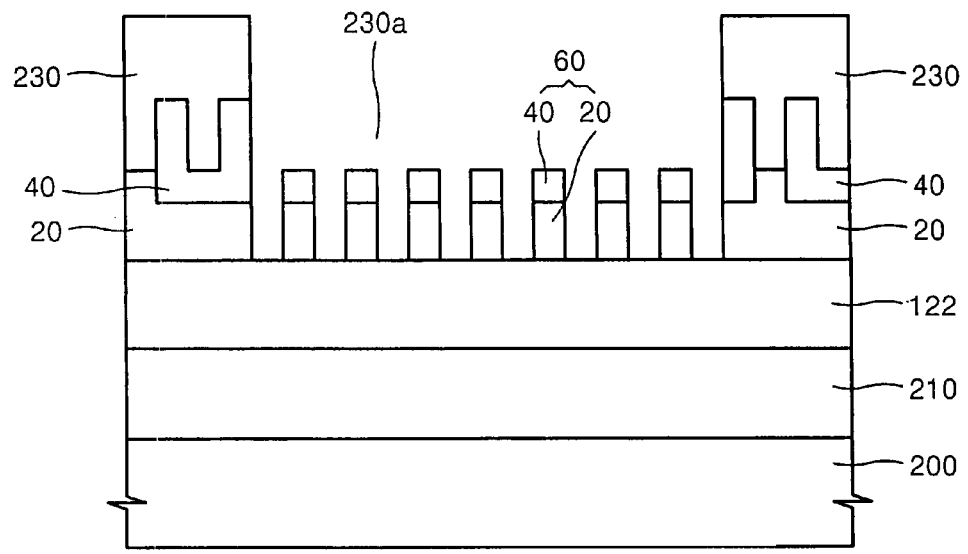

Referring to FIG. 8C, the mask 230 and the projections of the second hard mask layer 40 are together used as an etch mask to sequentially anisotropically etch the first hard mask layer 20. Thus, a hard mask 60 composed of residual portions of the first hard mask layer 20 and the second hard mask layer 40 are formed on the nitride film 122 only on a region exposed by the opening 230a. Also, upper surfaces of the nitride film 122 are exposed by the hard mask 60.

Figure 8D:
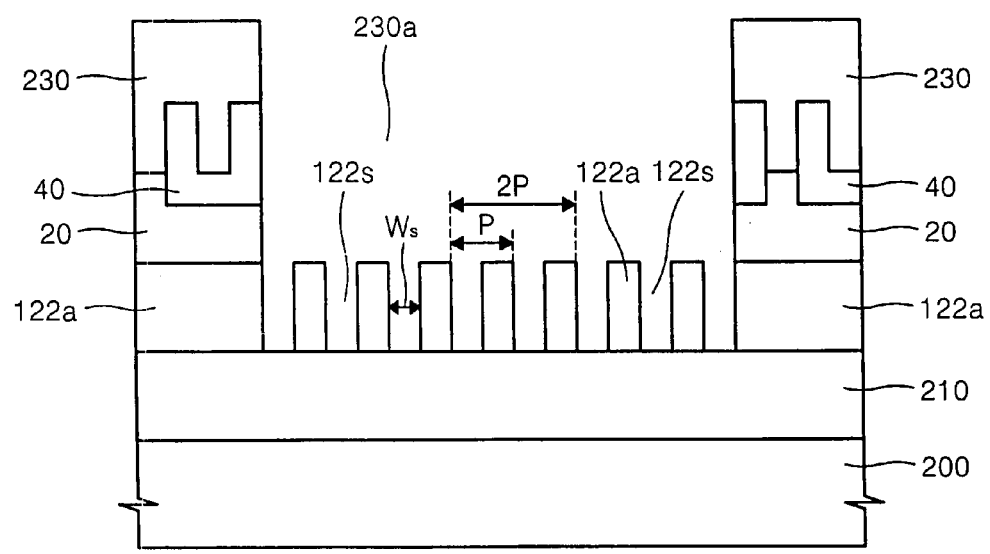

Referring to FIG. 8D, the nitride film 122 is anisotropically dry etched using the mask 230 and the hard mask 60 together as an etch mask to form a nitride film pattern 122a. FIG. 8D shows that none of the hard mask 60 remains on the nitride film pattern 122a after the anisotropic dry etching process. However, in some cases, a residual portion of the hard mask 60 may be left on the nitride film pattern 122a after the anisotropic dry etching process. In any case, the nitride film pattern 122a has a fine pitch P. Also, each space 122s of the nitride film pattern 122a has a width Ws that will correspond to the width Wx of each contact hole to be formed.

Figure 8E:
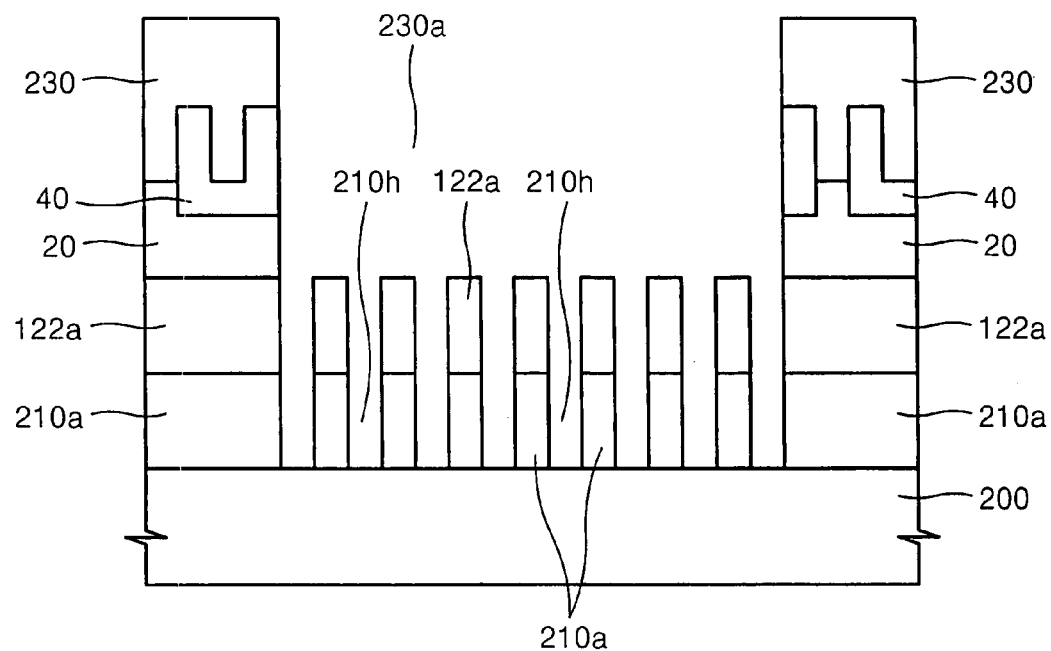

Referring to FIG. 8E, the interlayer insulating film 210 is anisotropically dry etched using the mask 230 and the nitride film pattern 122a together as an etch mask to form contact holes 210h in the insulating film, i.e., to form interlayer insulating film pattern 210a. At this time, upper surfaces of the semiconductor substrate 200 are exposed via the contact holes 210h.

Figure 8F:
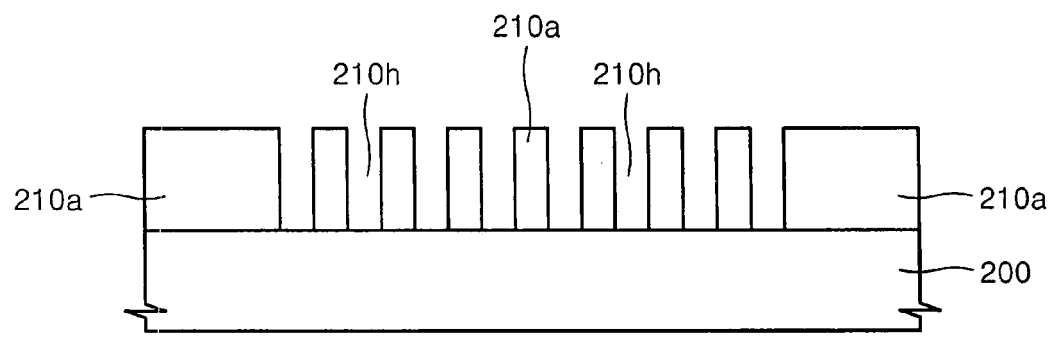

Referring to FIG. 8F, the nitride film pattern 122a, the first hard mask layer 20, the remainder of the second hard mask layer 40 and the mask 230 are removed.

As described with reference to FIGS. 8A through 8F, the hard mask 60 and the nitride film pattern 122a are formed in the region exposed by the opening 230a of the mask 230. Therefore, the hard mask 60 and the nitride film pattern 122a are subjected to relatively few additional processes before the dry etching process which forms the contact holes 210a is carried out. Accordingly, the hard mask 60 and the nitride film pattern 122a will not be deformed before the dry etching process is carried out. Hence, an ultra fine pattern of the contact holes 210a, e.g., a pattern of contact holes having a design rule of 20 nm or less, can be formed.

According to the present invention as described above, double patterning is used to form a pattern whose features are spaced from one another by a pitch which is a fraction of, and more specifically, more or less half, that which can be achieved by photolithography alone. Also, these features may have highly uniform critical dimensions (CD). In particular, a first sacrificial pattern formed by photolithography and a second sacrificial pattern self-aligned with the first sacrificial pattern establish the spacing and widths of contact holes, i.e., overlie the regions at which the contact holes will be formed. Accordingly, the uniformity of the critical dimensions of the contact holes does not depend on the dimensional accuracy of a pattern which surrounds the regions at which the contact holes are formed, as in the conventional double patterning method. Therefore, the design layouts for the method of the present invention can be directly based on the desired dimensions of the contact holes. That is, designing the layouts for the method of the present invention is easier than designing the layouts for a conventional double patterning method of forming contact holes. Furthermore, the features of the hard mask are formed all at once according to the present invention. Therefore, the critical dimensions of the pattern that can be formed using the hard mask can be more uniform than in the conventional method in which adjacent features of a hard mask are formed by discrete processes.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A method of forming a hard mask, comprising:
forming a first hard mask layer on a substrate;
forming a first sacrificial pattern of substantially identical features on the first hard mask layer, wherein the features are spaced from one another in a first direction by a first pitch;
forming a second hard mask layer on the first sacrificial pattern and the first hard mask layer, wherein the second hard mask layer delimits recesses each of which extends between a respective pair of adjacent ones of the features of the first sacrificial pattern;
forming a second sacrificial pattern within the recesses;
removing upper portions of the second hard mask layer to expose the first sacrificial pattern;
removing all parts of the first sacrificial pattern and all parts of the second sacrificial pattern; and
subsequently etching the second hard mask layer and the first hard mask layer to form a hard mask having a pattern of features composed of residual portions of the first hard mask layer and residual portions of the second hard mask layer disposed on the residual portions of the first hard mask layer.

2. The method of claim 1, wherein the removing of the first sacrificial pattern and the second sacrificial pattern comprises etching the first and second sacrificial patterns using an etchant, and the etchant provides an etch selectivity between the material of the first sacrificial pattern and the second sacrificial pattern and the material of the second hard mask layer.

3. The method of claim 2, wherein the first hard mask layer is one of an oxide film, a nitride film, and a combination of oxide and nitride films.

4. The method of claim 2, wherein the second hard mask layer is one of an oxide film, a nitride film, and a polysilicon film.

5. The method of claim 2, wherein the first sacrificial pattern and the second sacrificial pattern are both composed of one of an oxide, a nitride and polysilicon.

6. The method of claim 2, wherein the first hard mask layer and the second hard mask layer are each one of an oxide film and a nitride film, and the first sacrificial pattern and the second sacrificial pattern are both composed of polysilicon.

7. The method of claim 1, wherein the second hard mask layer is formed to such a thickness that the pattern of the hard mask has features spaced from one another in the first direction by a pitch that is ½ of the first pitch.

8. The method of claim 1, wherein the second sacrificial pattern is formed so as to occupy the same stratum as the first sacrificial pattern.

9. The method of claim 1, further comprising removing a portion of the first hard mask layer exposed between features of the first sacrificial pattern to form recesses in the first hard mask layer, before the second hard mask layer is formed, and wherein the forming of the second hard mask layer comprises forming a conformal hard mask layer over the first sacrificial pattern and surfaces of the first hard mask layer defining the bottom of the recesses to a thickness equal to the thickness of the portion of the first hard mask layer removed from between the features of the first sacrificial pattern.

10. The method of claim 1, wherein the removing of part of the second hard mask layer to expose upper surfaces of the features of the first sacrificial pattern comprises wet etching the second hard mask layer.

11. The method of claim 1, wherein the removing of part of the second hard mask layer to expose upper surfaces of the features of the first sacrificial pattern comprises dry etching the second hard mask layer.

12. The method of claim 1, wherein the removing of the first sacrificial pattern and the second sacrificial pattern comprises wet etching the first and second sacrificial patterns.

13. The method of claim 12, wherein the first sacrificial pattern and the second sacrificial pattern are both composed of polysilicon, and
and the wet etching comprises exposing the first and second sacrificial patterns to an etchant comprising $NH_4OH$.

14. The method of claim 13, wherein the etchant is a mixture of $NH_4OH$, $H_2O_2$ and $H_2O$.

15. The method of claim 1, wherein the first sacrificial pattern and the second sacrificial patterns are both composed of polysilicon, and
the removing of the first and second sacrificial patterns comprises chemically dry etching the first and second sacrificial patterns using an etchant comprising $CF_4$.

16. The method of claim 15, wherein the etchant is a gaseous mixture of $CF_4$ and $O_2$.

17. The method of claim 15, wherein the etchant is a gaseous mixture of $CF_4$, $O_2$, $N_2$ and HF.

18. A method of forming a hard mask, comprising:
forming a first hard mask layer on a substrate;
forming a first sacrificial pattern by photolithography on the first mask layer, the first sacrificial pattern having substantially identical features spaced from one another in a first direction by a first pitch;
subsequently forming side walls extending over sides of the features of the first sacrificial pattern, respectively, wherein the side walls delimit a respective recess between each pair of adjacent ones of the features of the first sacrificial pattern;
removing all parts of the first sacrificial pattern while leaving the side walls extending upright on the first hard mask layer; and
subsequently etching the side walls and the first hard mask layer to form a pattern of features located at positions corresponding to the locations of all of the sidewalls, respectively, wherein the features located at positions corresponding to the locations of all of the sidewalls are spaced from one another by a pitch that is a fraction of the first pitch.

19. The method of claim 18, wherein the forming of the side walls comprises forming a second mask layer on the first hard mask layer and the features of the first sacrificial pattern, and further comprising:
forming a second sacrificial pattern within the recesses delimited by the second hard mask layer such that the second sacrificial pattern is self-aligned by the second hard mask layer with the first sacrificial pattern; and removing the second sacrificial pattern before the second hard mask layer and the first hard mask layer are etched to form a pattern.

20. A method of forming a hard mask, comprising:

forming a first hard mask layer on a substrate;

forming a first sacrificial pattern of substantially identical features on the first hard mask layer, wherein the features are spaced from one another in a first direction by a first pitch;

removing a portion of the first hard mask layer exposed between features of the first sacrificial pattern to form recesses in the first hard mask layer;

forming a conformal hard mask layer over the first sacrificial pattern and surfaces of the first hard mask layer defining the bottom of the recesses to a thickness equal to the thickness of the portion of the first hard mask layer removed from between the features of the first sacrificial pattern, and such that the conformal hard mask layer delimits recesses each of which extends between a respective pair of adjacent ones of the features of the first sacrificial pattern;

forming a second sacrificial pattern within the recesses delimited by the conformal hard mask layer;

removing upper portions of the second hard mask layer to expose the first sacrificial pattern;

subsequently removing the first sacrificial pattern and the second sacrificial pattern; and subsequently etching the conformal hard mask layer and the first hard mask layer to form a hard mask having a pattern of features composed of residual portions of the first hard mask layer and residual portions of the conformal hard mask layer disposed on the residual portions of the first hard mask layer 21. The method of claim 20, wherein all parts of the first sacrificial pattern and all parts of the second sacrificial pattern are removed after the upper portions of the second hard mask layer have been removed to expose the first sacrificial pattern.

* * * * *